US006999292B2

(12) United States Patent
Clara et al.

(10) Patent No.: US 6,999,292 B2
(45) Date of Patent: Feb. 14, 2006

(54) ACTIVE PROTECTION DEVICE FOR LOW VOLTAGE CIRCUITS IN ITEMS OF LOW VOLTAGE EQUIPMENT

(75) Inventors: Martin Clara, Villach (AT); Andreas Wiesbauer, Pörtschach (AT)

(73) Assignee: Infineon Technologies AG, Munich (DE)

( * ) Notice: Subject to any disclaimer, the term of this patent is extended or adjusted under 35 U.S.C. 154(b) by 328 days.

(21) Appl. No.: 10/303,188

(22) Filed: Nov. 25, 2002

(65) Prior Publication Data

US 2003/0117757 A1    Jun. 26, 2003

(30) Foreign Application Priority Data

Nov. 28, 2001  (DE) ............................... 101 58 244

(51) Int. Cl.
 *H02H 9/00*        (2006.01)
(52) U.S. Cl. ........................................ 361/91.1; 361/56
(58) Field of Classification Search ............... 361/54, 361/56, 58, 91.1, 91.5, 91.6, 91.8, 93.8, 110, 361/111
See application file for complete search history.

(56) References Cited

U.S. PATENT DOCUMENTS

| | | | | |
|---|---|---|---|---|
| 3,919,601 A | * | 11/1975 | Suko et al. ............ | 361/100 |
| 4,268,789 A | * | 5/1981 | Nagano .................. | 323/315 |
| 4,704,654 A | * | 11/1987 | Aberle et al. ........... | 361/90 |
| 5,157,571 A | * | 10/1992 | Gotz ....................... | 361/54 |
| 6,111,737 A | * | 8/2000 | Baldwin et al. ......... | 361/91.1 |
| 6,617,906 B1 | * | 9/2003 | Hastings ................. | 327/321 |

FOREIGN PATENT DOCUMENTS

| | | |
|---|---|---|
| DE | 198 33 345 A1 | 1/2000 |
| DE | 199 30 036 A1 | 1/2001 |
| EP | 0 351 756 A1 | 1/1990 |

OTHER PUBLICATIONS

"Micropower Voltage Regulator", Motorola, Inc., 1998, USA, pp 1-7.

* cited by examiner

*Primary Examiner*—Brian Sircus
*Assistant Examiner*—Danny Nguyen
(74) *Attorney, Agent, or Firm*—Jenkins, Wilson & Taylor, P.A.

(57) ABSTRACT

The invention establishes a method and a device for supplying external circuit units with an overvoltage (101), present on a high voltage circuit (100), in which connected items of low voltage equipment (116) are protected from damage due to the applied overvoltage (101), a protection device (111) for the protection of the item of low voltage equipment (116) from damage due to the overvoltage (101) present on the high voltage circuit (100) being connected in such a way that the protection device (111) is connected in series between the high voltage circuit (101) [sic] and the item of low voltage equipment (116), and a low voltage (112), which is applied to a low voltage node (110), which is arranged between the protection device (111) and the item of low voltage equipment (116), and which is made available to the item of low voltage equipment (116), being clamped by means of the protection device (111) to a voltage value, which does not exceed a definable voltage value of the protection voltage (113), in such a way that the low voltage circuits (115) contained in the item of low voltage equipment (116) are protected from damage due to overvoltages.

12 Claims, 5 Drawing Sheets

ACTIVE PROTECTION DEVICE FOR LOW VOLTAGE CIRCUITS IN ITEMS OF LOW VOLTAGE EQUIPMENT

TECHNICAL FIELD

The present invention relates to a method and a device for supplying external circuit units with supply voltages, for example, with an overvoltage, present on a high voltage circuit, and, in particular, relates to a protective device, by means of which connected items of low voltage equipment are protected from damage due to an overvoltage applied by the high voltage circuit.

BACKGROUND ART

In the following, voltages, which in their voltage range or voltage spread lie above the voltages with which items of low voltage equipment are to be supplied, are designated as "overvoltages". The term "high voltage circuit" encompasses all circuits, which can provide a voltage, the voltage range or voltage spread of which can exceed the permissible voltage range or voltage spread for external circuit units.

Circuit elements in MOS (Metal Oxide Silicon) technology as well as CMOS (Complementary Metal Oxide Silicon) technology have a range of advantages with regard to high switching speeds at low voltages and currents. A disadvantage of these and other sensitive circuit elements consists in the fact that they can only be operated with limited operating voltages, i.e. the circuit elements are easily damaged or completely destroyed by any overvoltages that occur.

Various process technologies have partially solved this problem by, for example, manufacturing MOS transistors with a thick gate oxide. The thicker a gate oxide of a MOS transistor is, the higher the voltage is, which can be applied to circuit elements of this kind. A disadvantage of MOS transistors with thick gate oxide consists in a reduction of switching speed. The following table, which lists different process technologies, is given as an example of circuit elements with a normal gate oxide thickness compared with circuit elements with an increased gate oxide thickness.

TABLE 1

Typical supply voltages for CMOS processes

| Process technoogy | Maximum operating voltage for circuit elements with "normal" gate oxide thickness | Maximum operating voltage for circuit elements with increased gate oxide thickness |
| --- | --- | --- |
| 0.35 μm | 3.3 V | 5 V |
| 0.18 μm | 1.8 V | 3.3 V |
| 0.13 μm | 1.2 V | 2.5 V |

The maximum permissible operating voltage is usually 10% more than the nominal value given in the table shown above. When customary circuit elements are operated with a voltage, which exceeds the maximum (e.g. 2 V in a 0.18 μm CMOS process), they will be damaged. The nominal operating voltages for customary circuit elements and for circuit elements with thick gate oxide are designated in the following as VopL and VopH, respectively.

In a disadvantageous manner, many actuators require higher voltages than the maximum permissible operating voltage for CMOS circuit elements. Examples are laser diodes, motors, loudspeakers and chip-to-chip interfaces. If actuators and driver units are constructed on one chip (system-on-chip, SoC), the problems increase. Actuators often work with high voltages (overvoltages), which exceed the voltages listed in Table 1.

Circuit arrangements according to the state of the art are illustrated in FIG. 1. FIG. 1(a) shows an arrangement in which a circuit module 107, which can be operated at low operating voltage and through which a module current 109 flows, is connected to a high voltage circuit 100. The arrow 102 shown in FIG. 1(a) designates a low voltage while the arrow 101 shown in FIG. 1(a) designates an overvoltage. It can therefore clearly be seen that the overvoltage 101 can endanger a correct operation of the circuit module 107, as, under certain operating conditions, in particular when a low current flows through the at least one circuit module 107, a circuit module connection voltage can become higher than a voltage VopL. For example, if the module current is switched off completely, the connecting point between the circuit module 107 and the high voltage circuit 100 can assume the potential of the overvoltage 101 and the MOS circuit elements in the circuit module 107 will certainly be destroyed.

Thus, attempts are made in various ways to protect the sensitive CMOS circuit elements from too high voltages (overvoltages). FIG. 1(b) shows a conventional method for protecting circuit modules 107. In the figure, a low voltage node 110 is shown, to which is connected the high voltage circuit 100, which is connected to the overvoltage 101. Furthermore, one connection of the circuit module 107 is connected to the low voltage node 110 while another connection of the circuit module 107 is connected to ground 108.

The module current 109 flows through the circuit module, as explained with reference to FIG. 1(a). Furthermore, a series circuit consisting of a protection element 103 and a voltage source 106 is connected between the low voltage node 110 and ground 108. A protection element voltage 104 is dropped across the protection element 103 while the voltage source 106 provides a bias voltage 105. This so-called parallel protection device clamps the low voltage node 110 at a voltage, which is not dangerous for the circuit module 107. This is achieved by setting the bias voltage 105 to a value, which corresponds to a difference between the maximum permissible operating voltage of the circuit module 107, i.e. the maximum low voltage 102, and the protection element voltage 104. As an example, a protection element 103 is shown in FIG. 1(b), which is formed by a semiconductor diode. When the voltage across the protection element 103 exceeds a trigger voltage, i.e. a protection element voltage 104, the protection element 103 becomes low resistance and clamps the low voltage 102 to the sum of the bias voltage 105 and the protection element voltage 104.

Further tests have been carried out to overcome the overvoltages 101 present on the high voltage circuits 100. The installation of transistors in the circuit module 107, which are suitable for high voltages of this kind, has been tried. In a disadvantageous manner, the transistors are difficult to obtain and considerably more expensive than conventional transistors. In a CMOS process, they have a thick gate oxide, which has the consequence of a low switching speed and large structural size.

A circuit with parallel protection device according to FIG. 2(b) has the disadvantage that the total current is divided between the high voltage circuit 100 and the circuit module 107 (parallel connection), thus interfering with a total current flow. Furthermore, a modification of the signal, i.e. of the current, which is to be transferred to the high voltage circuit or to the high voltage circuits, occurs in a disadvantageous manner.

SUMMARY OF THE INVENTION

It is therefore an object of the present invention to provide a protection device, which can be arranged in series between a circuit module and a high voltage circuit.

If, in doing so, the high voltage circuit acts like a linear resistance, the serial protection device must have a low impedance for high driver currents and a high impedance for low driver currents.

A dependence of this kind of a resistance on the current must change with a frequency, which can be significantly more than 100 MHz for laser driver applications, it not being possible to provide a serial protection device of this kind using passive elements.

This object is achieved according to the invention by means of the method given in Patent Claim 1 and by means of a device with the characteristics of Patent Claim 7. Further embodiments of the invention can be seen from the sub-claims.

An important idea of the invention consists in providing a serial protection device, which can be connected to a MOS circuit, the loads on the MOS circuit to be controlled (to be driven) requiring significantly higher voltages than those permissible for the (C)MOS components of a driving circuit module. An active serial protection device is provided, which can have definable voltage values of a protection voltage applied to it in order to guarantee a protection of low voltage circuits contained in an item of low voltage equipment.

It is thus an advantage of the present invention that, by means of a serial protection device, the signal (current) that is to be transferred to a high voltage circuit is not modified in its magnitude and, in particular, no transverse currents required for the protection of low voltage circuit modules are tapped off from a connection node between the high voltage circuit and the driver circuit (CMOS or bipolar circuit).

It is further advantageous that the serial protection device is constructed from few active circuit elements.

Furthermore, the serial protection device can work at very high frequencies, as the device itself can be constructed from MOS transistors.

The method according to the invention for supplying circuit units with an overvoltage present on a high voltage circuit, in which connected items of low voltage equipment are protected from damage due to the applied overvoltage, essentially has the following steps:

a) provision of a high voltage circuit for the application of an overvoltage, which supplies the circuit units, it being possible to adjust the applied overvoltage to suit the external circuit units such as laser diodes, loudspeakers and motors, for example;

b) provision of at least one item of low voltage equipment with at least one low voltage circuit for carrying out low voltage circuit functions and with at least one protection voltage source for the provision of at least one protection voltage whereby the low voltage circuit functions serve to drive or control the high voltage circuit;

c) connection of a protection device for the protection of the item of low voltage equipment from damage due to the overvoltage present on the high voltage circuit in such a way that the protection device is connected in series between the high voltage circuit and the item of low voltage equipment, which contains the at least one low voltage circuit; and d) clamping, by means of the protection device, of a low voltage, which is applied to a low voltage node, which is arranged between the protection device and the item of low voltage equipment, and which is made available to the item of low voltage equipment, to a voltage value, which does not exceed a definable voltage value of the protection voltage, in such a way that the item of low voltage equipment is protected from damage due to overvoltages.

Advantageous developments and improvements of the specific subject matter of the invention are included in the sub-claims.

According to a preferred improvement of the present invention, a clamping voltage applied to at least one low voltage circuit, which is provided in the item of low voltage equipment, is clamped in the protection device to a voltage value below the definable voltage value of the protection voltage.

According to a further preferred improvement of the present invention, a clamping current is maintained by means of the protection device at a current value less than a current value of a main current flowing into the item of low voltage equipment.

According to yet a further preferred improvement of the present invention, the protection device is provided integrally in the high voltage circuit.

According to yet a further preferred improvement of the present invention, the clamping voltage is set to a voltage value less than the voltage value of the maximum low voltage that can be applied to the item of low voltage equipment.

According to yet a further preferred improvement of the present invention, a protection current provided by a protection current source prevents the potential present at the low voltage node from varying when the main current through the high voltage circuit becomes zero.

The device according to the invention for the protection of items of low voltage equipment, which work together with a high voltage circuit, from damage due to an overvoltage present on the high voltage circuit, furthermore has:

a) a protection device;

b) at least one protection voltage source for the provision of at least one protection voltage, which can be applied to the protection device;

c) a low voltage node, which is arranged between the protection device and the item of low voltage equipment, for the application of a definable clamping voltage to at least one low voltage circuit in the low voltage protection device, the clamping voltage not exceeding a maximum permissible protection voltage.

BRIEF DESCRIPTION OF THE DRAWINGS

Exemplary embodiments of the invention are shown in the drawings and are explained in more detail in the following description.

In the drawings.

DETAILED DESCRIPTION OF THE INVENTION

In the figures, the same references designate the same or functionally identical components or steps.

Figure 2:
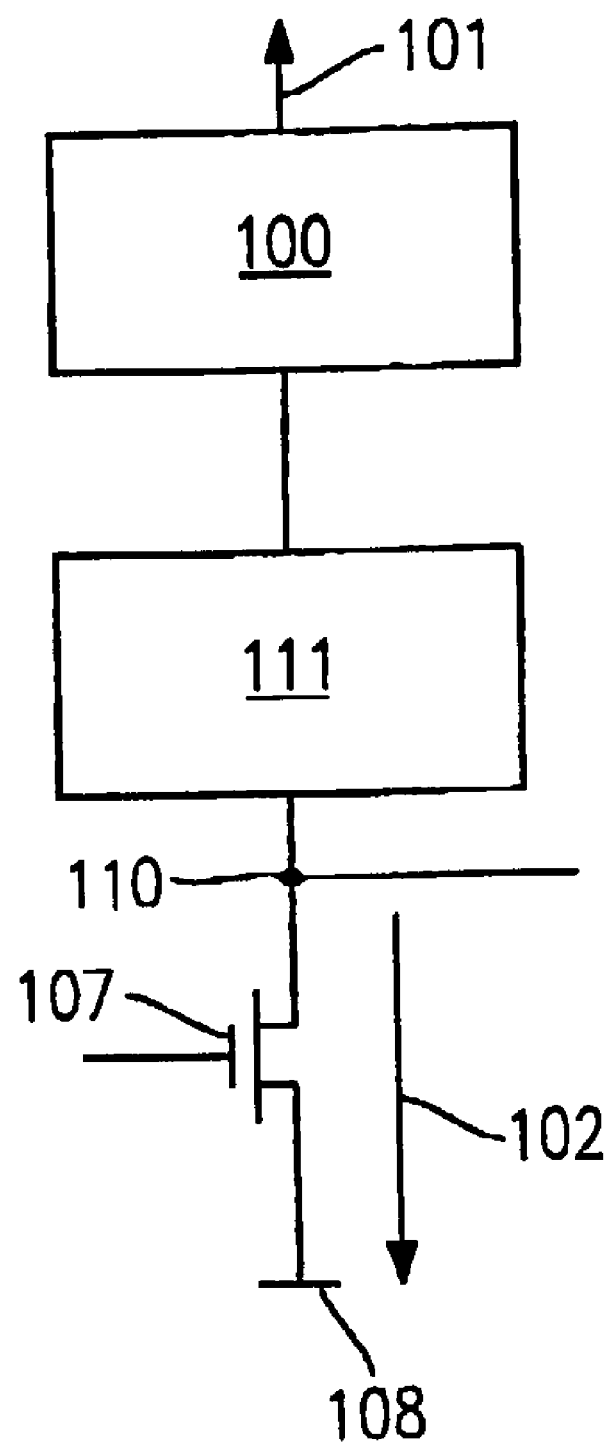
FIG. 2 shows a basic block diagram of the device according to the invention for the protection of a circuit module from overvoltages present on a high voltage circuit, in which a protection device is placed in series between the high voltage circuit and the protection device.

FIG. 2 shows a typical block diagram of a serial protection device 111, which is connected in series between a high voltage circuit 100, which outputs an overvoltage 101, and a circuit module 107, which is to be protected from high voltages, in particular, from the overvoltage 101. This so-called serial protection device 111 ensures that a maximum voltage value of a low voltage 102, which is present at the circuit module 107, is not exceeded. In particular, the low voltage 102 is present between a low voltage node 110 and a ground 108.

Figure 3:
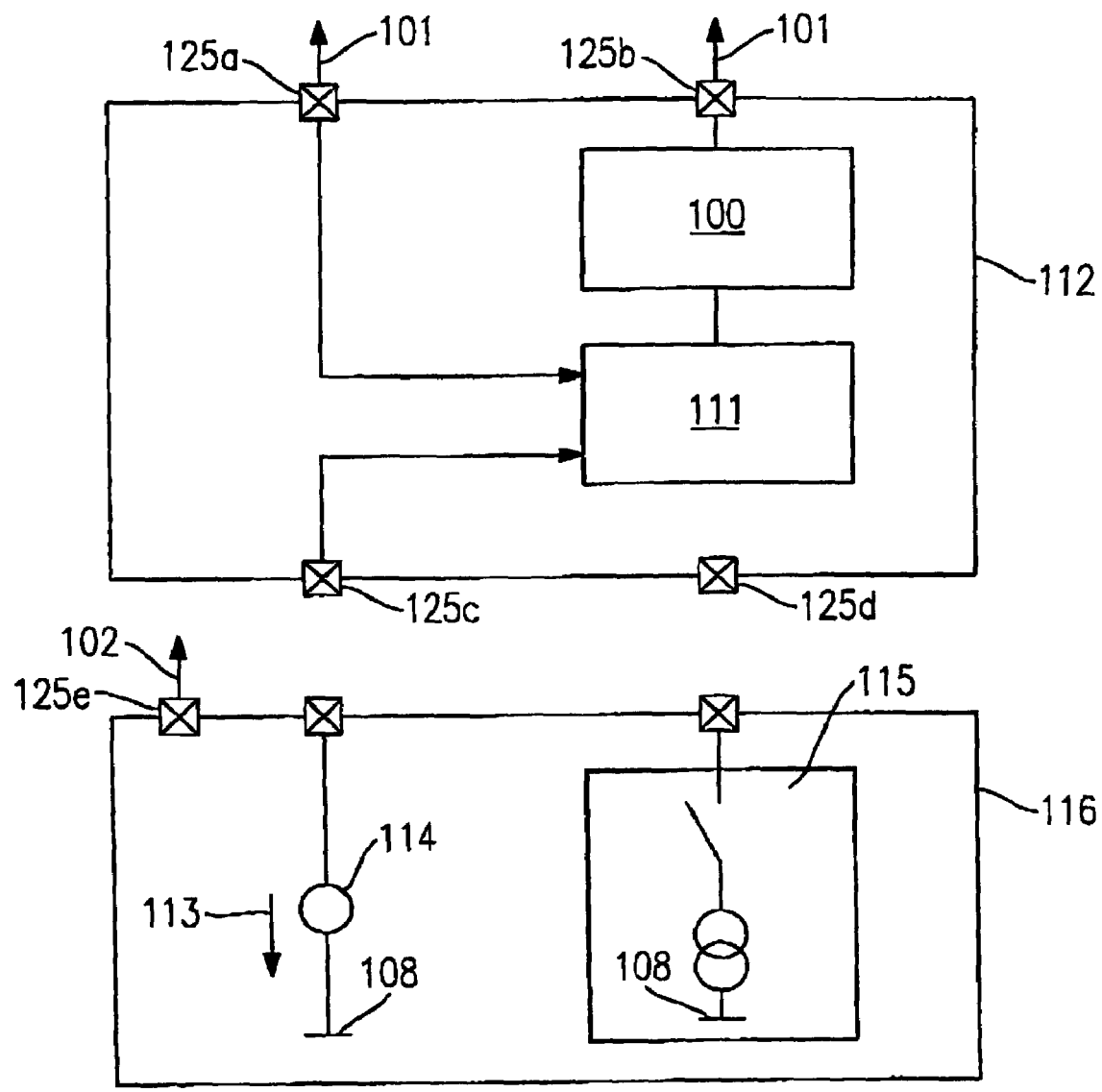
FIG. 3 shows an exemplary embodiment of the device according to the invention for the protection of items of low voltage equipment, which work together with a high voltage circuit, in accordance with an exemplary embodiment of the present invention.

FIG. 3 shows in more detail how a protection device 111 is integrated into an item of high voltage equipment 112, the item of high voltage equipment 112 containing the high voltage circuit 100, which is required for the application of the overvoltage 101.

The item of high voltage equipment 112 is connected to four connection units 125a, 125b, 125c and 125d. The connection units 125c and 125d serve to connect the item of high voltage equipment 112 to the item of low voltage equipment 116 while overvoltages 101 are output from each of the connection units 125a and 125b. A reference voltage potential in the form of a protection voltage 113, which is provided by a protection voltage source 114, is fed to the protection device 111 via the connection unit 125c. This protection voltage is present between the connection unit 125c and ground 108. Furthermore, the overvoltage 101 is applied to the protection device 111 via the connection unit 125a. The operation of the protection device, which has applied to it the protection voltage 113 on the one hand and the overvoltage 101 on the other, is described in more detail below with reference to FIGS. 4 and 5.

The main current, which flows between at least one low voltage circuit 115, which is contained within the item of low voltage equipment 116, and the item of high voltage equipment 112, is fed via the connection unit 125d. Furthermore, the item of low voltage equipment 116 has a low voltage 102 applied to it on a further connection unit 125e.

Figure 4:
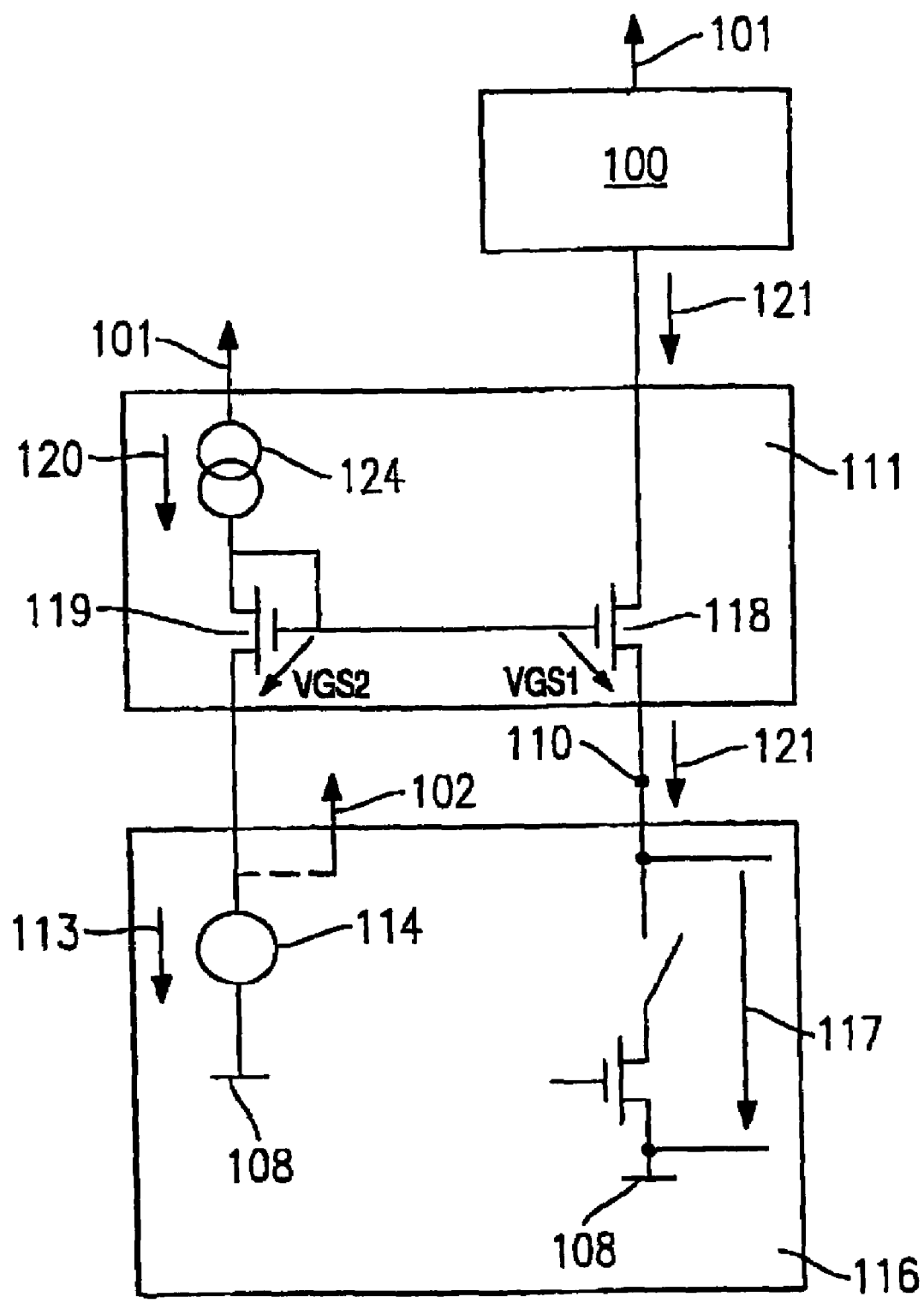
FIG. 4 shows a design of the protection device according to the invention according to a further exemplary embodiment of the present invention.

FIG. 4 shows the design of a protection device 111 in greater detail. A clamping current source 124 provides a clamping current 120, which is fed to a drain connection of a second protection transistor 119. The gate connection and the drain connection of the second protection transistor are connected together and to a gate connection of a first protection transistor 118. The first 118 and second protection transistors 119 form a so-called cascode circuit in the protection device 111. A voltage spread on the drain connection of the second protection transistor 119 is reduced in the cascode circuit, the cascode circuit being able to operate at high frequencies (100 MHz) if it is designed using MOS transistors. It is also an advantage that a current modification to a main current 121 from the high voltage circuit 100 via the protection device 111 to the item of low voltage equipment 116 does not occur. In order to ensure that a maximum permissible low voltage 102 is not exceeded, the cascode circuit is controlled by means of a so-called translinear loop, which ensures that a clamping voltage 117, which is present between the low voltage node 110 and ground 108, is always less than a maximum permissible low voltage 102.

The way in which the translinear loop works is described in more detail in the following. Due to a loop formed by the protection voltage source 114, the gate-source path of the second protection transistor 119, the gate-source path of the first protection transistor 118 and the clamping voltage, the sum of the protection voltage 113 and the gate-source voltage VGS2 of the second protection transistor 119 is equal to the sum of the clamping voltage 117 and the gate-source voltage VGS1 of the first protection transistor 118. If the clamping current 120 is less than the main current 121, then the relationship $$VGS2 \leq VGS1$$

applies. This means that the clamping voltage 117 is always less than the protection voltage 113, whereby it is assumed that the two protection transistors 118, 119 have similar characteristics. In a simple embodiment, the protection voltage 113 can be connected directly to the low voltage 102 as shown by a dotted line in the item of low voltage equipment 116 in FIG. 4.

Figure 5:
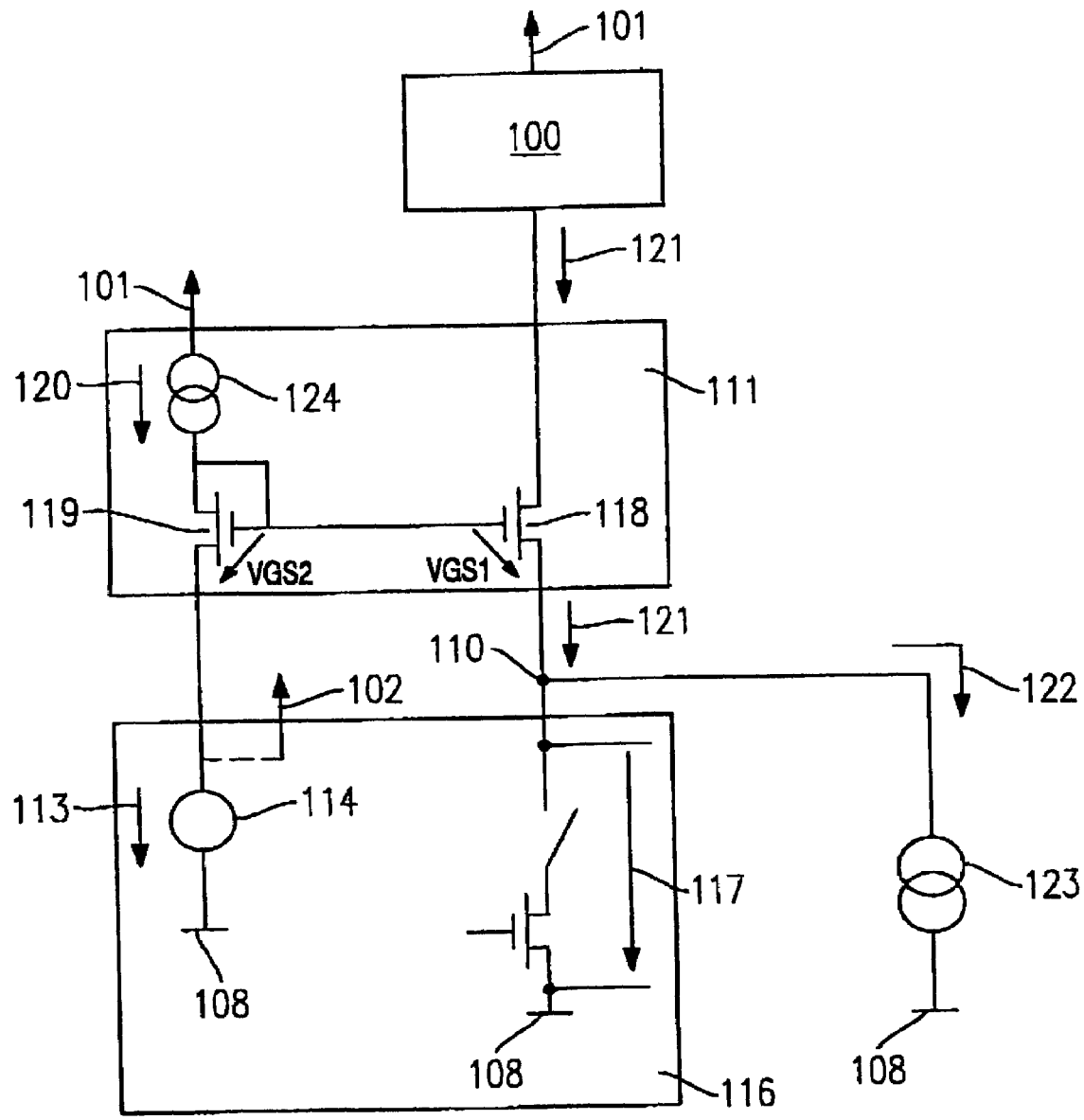
FIG. 5 shows a modified design of a protection device according to a further exemplary embodiment of the present invention.

FIG. 5 shows a further preferred exemplary embodiment of the present invention, which represents an extension of the circuit arrangement shown in FIG. 4 to the effect that the case is investigated where the main current 121 becomes zero. The condition necessary for the cascode circuit of FIG. 4, i.e. the condition that the clamping current 120 is less than or equal to the main current 121, also applies to a case where the main current 121 becomes zero (clamping current 120 is likewise zero). It should be pointed out, however, that in this case, i.e. main current 121 equal to zero, the low voltage node 110 "floats". This means that a potential present on the low voltage node 110 can vary when the main current 121 becomes zero. This undesirable variation or "floating" of the potential on the low voltage node 110 is prevented by incorporating an additional protection current source 123, which provides a protection current 122, the protection current source 123 being connected between the low voltage node 110 and ground 108.

In this configuration, the clamping current 120 can be chosen to be equal to the protection current 122, it being ensured that the condition "clamping current 120≦main current 121" is maintained. The protection current, which flows parallel to the low voltage circuit 115, which is contained within the item of low voltage equipment 116, must be provided when the item of low voltage equipment 116 is switched off and, furthermore, must be chosen to be sufficiently small in order not to interfere with an operation of the item of high voltage equipment.

In an advantageous manner, the protection device 111 can be integrated within the item of high voltage equipment 112 as shown schematically in the block diagram of FIG. 3, this circuit arrangement allowing the highest switching speeds.

Furthermore, the protection device 111 can be provided as a separate, individual circuit device as explained with reference to FIG. 2. Integration of the protection device 111 into the item of low voltage equipment 116 represents a further option when a process technology can provide two types of transistors (see Table 1) and the high voltage transistor is rated for an overvoltage 101. Furthermore, in an advanced digital process, the current source and the switches shown can be implemented with a low supply voltage with numerous advantages such as:

(i) a high integration density with a large digital chip;
(ii) a higher speed for switching devices (faster transistors in advanced processes); and
(iii) a smaller area for current source devices.

In an advantageous manner, the protection device increases design flexibility for circuits with different voltage domains. Current sources in conventional items of equipment, which in themselves are not rated for higher supply voltages, can be connected to the high voltage domain by inserting the serial protection device according to the invention, whereby the main current to the high voltage circuit is not changed.

Application examples of the protection device for the protection of items of low voltage equipment, which drive high voltage circuits, are driver circuits for laser diodes in optical communications technology; chip-to-chip interfaces in current mode where chips have different supply voltages; driver circuits for loudspeakers and driver circuits for motors.

Figure 1:
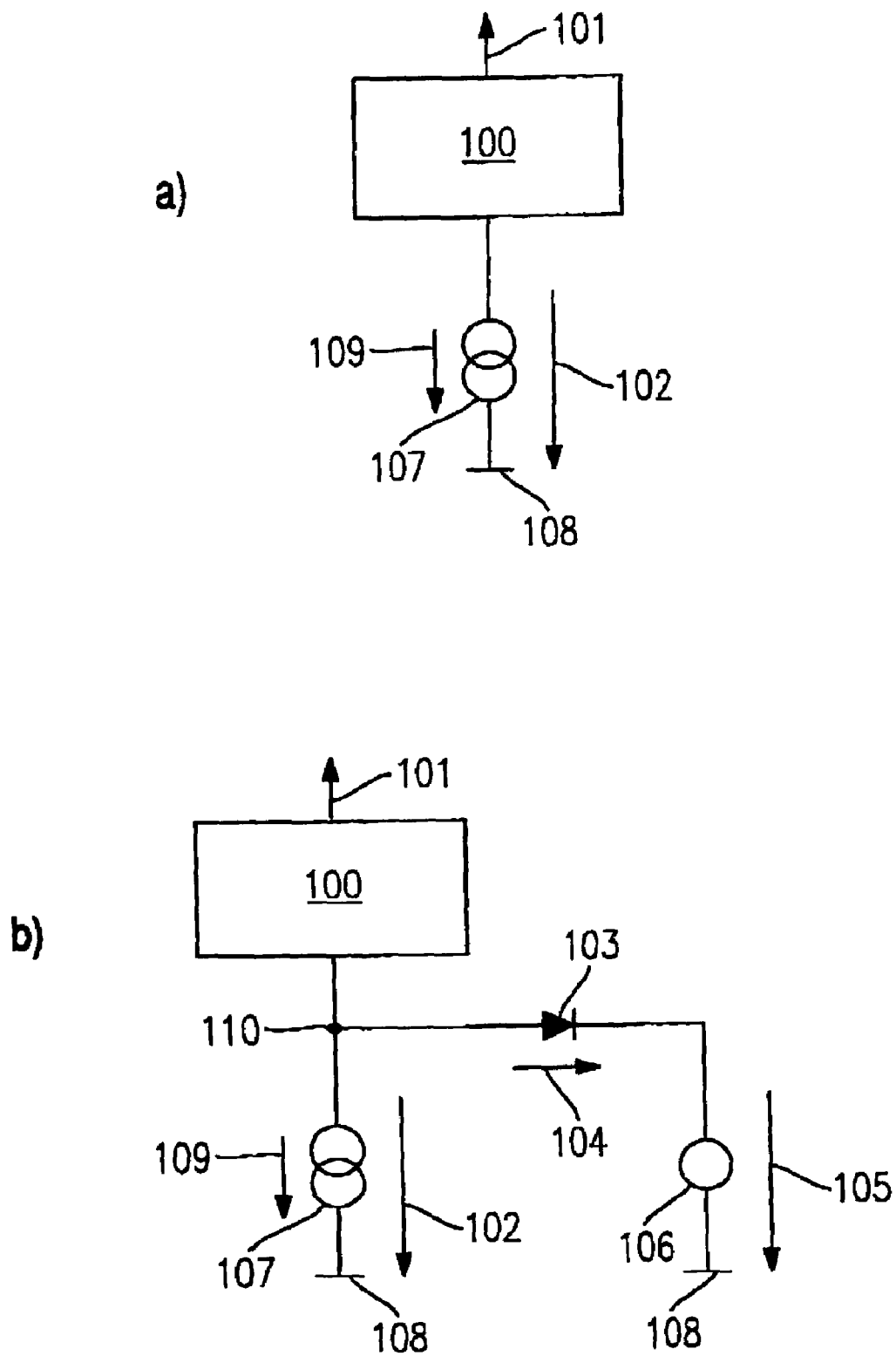
FIG. 1(a) shows a conventional control of a high voltage circuit with a circuit module without protection device.
FIG. 1(b) shows a conventional parallel protection device for the protection of a circuit module, which controls a high voltage circuit.

Reference is made to the introduction to the description with regard to the conventional circuit arrangements shown in FIGS. 1(a) and 1(b).

Although the present invention has been described above with reference to preferred exemplary embodiments, it is not restricted to these but can be modified in a variety of ways.

Also, the invention is not restricted to the possible applications mentioned.

LIST OF REFERENCES

The figures, the same references designate the same or functionally identical components or steps.
100 High voltage circuit
101 Overvoltage
102 Low voltage
103 Protection element
104 Protection element voltage
105 Bias voltage
106 Voltage source
107 Circuit module
108 Ground
109 Module current
110 Low voltage node
111 Protection device
112 Item of high voltage equipment
113 Protection voltage
114 Protection voltage source
115 Low voltage circuit
116 Item of low voltage equipment
117 Clamping voltage
118 First protection transistor
119 Second protection transistor
120 Clamping current
121 Main current
122 Protection current
123 Protection current source
124 Clamping current source
125a, Connection units
125b,
125c,
125d,
125e

The invention claimed is:

1. Method for supplying circuit units with an overvoltage present on a high voltage circuit, in which connected items of low voltage equipment are protected from damage due to the applied overvoltage, the method comprising:
   a) provisioning the high voltage circuit for the application of the overvoltage, which supplies the circuit units;
   b) provisioning at least one item of low voltage equipment with at least one low voltage circuit for carrying out low voltage circuit functions and with at least one protection voltage source for the provision of at least one protection voltage;
   c) connecting a protection device for the protection of the items of low voltage equipment from damage due to the overvoltage present on the high voltage circuit in such a way that the protection device is connected in series between the high voltage circuit and the items of low voltage equipment;
   d) feeding a reference voltage potential in the form of the protection voltage to the protection device via a connection unit, the protection voltage being present between the connection unit and ground, wherein the protection device is a serial protection device that ensures that a maximum voltage value of a low voltaae present at a circuit module is not exceeded;
   e) clamping, by means of the protection device, of the low voltage, which is applied to a low voltage node, which is arranged between the protection device and the items of low voltage equipment, and which is made available to the items of low voltage equipment, to a voltage value, which does not exceed a definable voltage value of the protection voltage, in such a way that the items of low voltage equipment are protected from damage due to overvoltages; and
   f) providing a protection current by a protection current source, wherein the protection current prevents the potential present at the low voltage node from varying when a main current flowing into the items of low voltage eguipment becomes zero.

2. Method according to claim 1, comprising clamping a clamping voltage applied to at least one low voltage circuit, which is provided in the items of low voltage equipment, in the protection device to a voltage value below the definable voltage value of the protection voltage.

3. Method according to claim 1, comprising maintaining a clamping current by means of the protection device at a current value less than a current value of the main current flowing into the items of low voltage equipment.

4. Method according to claim 1, comprising providing the protection device integrally with the high voltage circuit.

5. Method according to claim 1, comprising setting the clamping voltage to a voltage value less than the voltage value of the maximum low voltage that can be applied to the items of low voltage equipment.

6. Device for the protection of items of low voltage equipment, which work together with a high voltage circuit, from damage due to an overvoltage present on the high voltage circuit, the device comprising:
   a) a protection device;
   b) at least one protection voltage source for the provision of at least one protection voltage, which can be applied to the protection device;
   c) a connection unit for feeding a reference voltage potential in the form of the protection voltage to the protection device, the protection voltage being present between the connection unit and ground;

d) a low voltage node, which is arranged between the protection device and the items of low voltage equipment, for the application of a definable clamping voltage to at least one low voltage circuit in the low voltage protection device, the clamping voltage not exceeding a maximum permissible protection voltage; and e) a protection current source adapted to provide a protection current which prevents the potential present at the low voltage node from varying when a main current flowing into the items of low voltage equipment becomes zero.

7. Device according to claim 6, wherein the protection device is connected in series between the high voltage circuit and the items of low voltage equipment.

8. Device according to claim 6, wherein the protection device comprises:

a) a clamping current source for the provision of a clamping current;

b) a first protection transistor; and c) a second protection transistor.

9. Device according to claim 8, wherein the first and second protection transistors of the protection device form a cascode circuit.

10. Device according to claim 6, wherein the protection device is designed integrally with the high voltage circuit and has four connection units.

11. Device according to claim 6, wherein the protection device is designed integrally with the items of low voltage equipment.

12. Device according to claim 6, wherein the protection device is provided as an individual circuit unit, which is connected in series between the high voltage circuit and the items of low voltage equipment.

* * * * *